US010497681B2

(12) United States Patent
Hung et al.

(10) Patent No.: US 10,497,681 B2
(45) Date of Patent: Dec. 3, 2019

(54) LIGHT-EMITTING DEVICE

(71) Applicant: Genesis Photonics Inc., Tainan (TW)

(72) Inventors: Cheng-Wei Hung, Tainan (TW); Jui-Fu Chang, Tainan (TW); Chin-Hua Hung, Tainan (TW); Yu-Feng Lin, Tainan (TW)

(73) Assignee: GENESIS PHOTONICS INC., Tainan (TW)

( * ) Notice: Subject to any disclaimer, the term of this patent is extended or adjusted under 35 U.S.C. 154(b) by 0 days.

(21) Appl. No.: 15/924,461

(22) Filed: Mar. 19, 2018

(65) Prior Publication Data

US 2018/0211942 A1 Jul. 26, 2018

Related U.S. Application Data

(63) Continuation of application No. 15/268,681, filed on Sep. 19, 2016, now Pat. No. 9,922,963.

(30) Foreign Application Priority Data

Dec. 31, 2015 (TW) ............................. 104144809 A

(51) Int. Cl.
*H01L 25/075* (2006.01)
*H01L 33/50* (2010.01)
(Continued)

(52) U.S. Cl.
CPC ........ *H01L 25/0753* (2013.01); *H01L 33/502* (2013.01); *H01L 33/505* (2013.01);
(Continued)

(58) Field of Classification Search
CPC ....... H01L 2924/00; H01L 2224/48091; H01L 2924/00014; H01L 25/0753; H01L 33/505; H01L 33/60; H01L 33/62
(Continued)

(56) References Cited

U.S. PATENT DOCUMENTS 6,155,699 A  12/2000 Miller et al.
6,919,586 B2  7/2005 Fujii
(Continued)

FOREIGN PATENT DOCUMENTS

CN  1366715 A  8/2002
CN  1971957 A  5/2007
(Continued)

OTHER PUBLICATIONS

Office Action issued in U.S. Appl. No. 15/073,673, filed Mar. 18, 2016, dated Feb. 8, 2018.
(Continued)

*Primary Examiner* — Jonathan Han
(74) *Attorney, Agent, or Firm* — McClure, Qualey & Rodack, LLP

(57) ABSTRACT

A light-emitting device includes a substrate, a light-emitting component, a wavelength conversion component, an adhesive and a reflective layer. The light-emitting component is disposed on the substrate. The wavelength conversion component includes a high-density phosphor layer and a lower-density phosphor layer. The adhesive is formed between the light-emitting device and the high-density phosphor layer. The reflective layer is formed above the substrate and covers a lateral surface of the light-emitting component, a lateral surface of the adhesive and a lateral surface of the wavelength conversion component.

18 Claims, 13 Drawing Sheets

Related U.S. Application Data

(60) Provisional application No. 62/220,249, filed on Oct. 14, 2015, provisional application No. 62/241,729, filed on Sep. 18, 2015.

(51) Int. Cl.
  *H01L 33/60* (2010.01)
  *H01L 33/54* (2010.01)
  *H01L 33/56* (2010.01)
  *H01L 33/48* (2010.01)
  *H01L 33/62* (2010.01)

(52) U.S. Cl.
  CPC ............ *H01L 33/508* (2013.01); *H01L 33/54* (2013.01); *H01L 33/56* (2013.01); *H01L 33/60* (2013.01); *H01L 33/486* (2013.01); *H01L 33/62* (2013.01); *H01L 2224/16225* (2013.01); *H01L 2933/005* (2013.01); *H01L 2933/0033* (2013.01); *H01L 2933/0041* (2013.01); *H01L 2933/0058* (2013.01)

(58) Field of Classification Search
  USPC ......... 257/81, 82, 91, 98, 99, 100, 116, 117, 257/432–437, 749, E33.056–E33.059, 257/E25.032
  See application file for complete search history.

(56) References Cited

U.S. PATENT DOCUMENTS

| | | |
|---|---|---|
| 7,045,828 B2 | 5/2006 | Shimizu et al. |
| 7,190,004 B2 | 3/2007 | Nagai et al. |
| 7,810,956 B2 | 10/2010 | Bierhuizen et al. |
| 7,888,691 B2 | 2/2011 | Krames |
| 8,350,283 B2 | 1/2013 | Nlshiuchi et al. |
| 8,362,515 B2 | 1/2013 | Cheng et al. |
| 8,461,610 B2 | 6/2013 | Ito et al. |
| 8,482,016 B2 | 7/2013 | Harada |
| 8,523,626 B2 | 9/2013 | Suehiro |
| 8,552,444 B2 | 10/2013 | Ide et al. |
| 8,552,453 B2 | 10/2013 | Takine |
| 8,723,167 B2 | 5/2014 | Sato et al. |
| 8,771,577 B2 | 7/2014 | Basin et al. |
| 8,860,061 B2* | 10/2014 | Kotani ............... H01L 33/54 257/98 |
| 8,877,528 B2 | 11/2014 | Ooyabu et al. |
| 8,890,188 B2 | 11/2014 | Park et al. |
| 8,957,434 B2 | 2/2015 | Sugizaki et al. |
| 8,987,774 B2 | 3/2015 | Oyamada |
| 9,006,763 B2 | 4/2015 | Ueno et al. |
| 9,022,828 B2 | 5/2015 | Imai |
| 9,065,033 B2 | 6/2015 | Lee et al. |
| 9,337,405 B2 | 5/2016 | Yamada et al. |
| 9,406,847 B2 | 8/2016 | Markytan et al. |
| 9,419,189 B1 | 8/2016 | David et al. |
| 9,490,398 B2 | 11/2016 | Oyamada et al. |
| 9,887,329 B2 | 2/2018 | Yamada |
| 9,922,963 B2 | 3/2018 | Hung et al. |
| 2003/0006509 A1 | 1/2003 | Suzuki et al. |
| 2003/0067070 A1 | 4/2003 | Kwon et al. |
| 2004/0119402 A1 | 6/2004 | Shiang et al. |
| 2005/0045897 A1 | 3/2005 | Chou et al. |
| 2006/0055309 A1 | 3/2006 | Ono et al. |
| 2006/0169994 A1 | 8/2006 | Tu et al. |
| 2006/0186427 A1 | 8/2006 | Takine et al. |
| 2007/0012940 A1 | 1/2007 | Suh et al. |
| 2007/0114552 A1 | 5/2007 | Jang et al. |
| 2007/0236940 A1 | 10/2007 | Kuroda et al. |
| 2008/0123024 A1 | 5/2008 | Han et al. |
| 2008/0150119 A1 | 6/2008 | Jang et al. |
| 2008/0246902 A1 | 10/2008 | Cheng |
| 2009/0242917 A1 | 10/2009 | Inoue et al. |
| 2009/0296389 A1 | 12/2009 | Hsu |
| 2010/0052001 A1 | 3/2010 | Li et al. |
| 2010/0066236 A1 | 3/2010 | Xu et al. |
| 2010/0117530 A1 | 5/2010 | Lin et al. |
| 2010/0258419 A1 | 10/2010 | Chung et al. |
| 2010/0258830 A1 | 10/2010 | Ide et al. |
| 2011/0001157 A1 | 1/2011 | McKenzie et al. |
| 2011/0025190 A1 | 2/2011 | Jagt |
| 2011/0079805 A1 | 4/2011 | Yu et al. |
| 2011/0102883 A1 | 5/2011 | Narendran et al. |
| 2011/0170303 A1 | 7/2011 | Wu et al. |
| 2011/0198780 A1 | 8/2011 | Basin et al. |
| 2011/0309398 A1 | 12/2011 | Ito et al. |
| 2012/0025218 A1* | 2/2012 | Ito ................... H01L 33/505 257/88 |
| 2012/0025247 A1 | 2/2012 | Ooyabu et al. |
| 2012/0061700 A1 | 3/2012 | Eder et al. |
| 2012/0077292 A1 | 3/2012 | Chang et al. |
| 2012/0161164 A1 | 6/2012 | Kim |
| 2012/0181569 A1 | 7/2012 | Choi |
| 2012/0223351 A1 | 9/2012 | Margalit |
| 2012/0235126 A1 | 9/2012 | Yamazaki et al. |
| 2012/0236582 A1* | 9/2012 | Waragaya ............ H01L 33/507 362/510 |
| 2012/0250320 A1 | 10/2012 | Harbers et al. |
| 2012/0261689 A1 | 10/2012 | Appelt et al. |
| 2012/0261700 A1 | 10/2012 | Ooyabu et al. |
| 2012/0305942 A1 | 12/2012 | Lo et al. |
| 2013/0001605 A1 | 1/2013 | Ishihara et al. |
| 2013/0037842 A1 | 2/2013 | Yamada et al. |
| 2013/0093313 A1 | 4/2013 | Oyamada |
| 2013/0094177 A1 | 4/2013 | Edwards |
| 2013/0105978 A1* | 5/2013 | Hung .................. H01L 33/60 257/751 |
| 2013/0121000 A1 | 5/2013 | Lee et al. |
| 2013/0194794 A1 | 8/2013 | Kim |
| 2013/0207141 A1 | 8/2013 | Reiherzer |
| 2013/0207142 A1 | 8/2013 | Reiherzer |
| 2013/0256711 A1 | 10/2013 | Joo et al. |
| 2013/0277093 A1 | 10/2013 | Sun et al. |
| 2013/0313594 A1 | 11/2013 | Han et al. |
| 2014/0009060 A1 | 1/2014 | Kimura et al. |
| 2014/0021493 A1 | 1/2014 | Andrews et al. |
| 2014/0042481 A1 | 2/2014 | Inoue et al. |
| 2014/0054621 A1* | 2/2014 | Seko ................... H01L 33/505 257/88 |
| 2014/0117396 A1 | 5/2014 | Eisert et al. |
| 2014/0124812 A1 | 5/2014 | Kuramoto et al. |
| 2014/0131753 A1 | 5/2014 | Ishida et al. |
| 2014/0138725 A1 | 5/2014 | Oyamada |
| 2014/0153238 A1 | 6/2014 | Nishimura et al. |
| 2014/0186979 A1 | 7/2014 | Tu et al. |
| 2014/0203451 A1 | 7/2014 | Kwon et al. |
| 2014/0252389 A1 | 9/2014 | Koizumi et al. |
| 2015/0014720 A1 | 1/2015 | Tien |
| 2015/0102373 A1 | 4/2015 | Lee et al. |
| 2015/0102377 A1 | 4/2015 | Huang et al. |
| 2015/0115300 A1 | 4/2015 | Tomizawa et al. |
| 2015/0179901 A1 | 6/2015 | Ok et al. |
| 2015/0188004 A1 | 7/2015 | Ozeki et al. |
| 2015/0200338 A1 | 7/2015 | Kim et al. |
| 2015/0263242 A1 | 9/2015 | Tomizawa et al. |
| 2015/0280078 A1 | 10/2015 | Yen et al. |
| 2015/0311405 A1 | 10/2015 | Oyamada et al. |
| 2016/0013373 A1 | 1/2016 | Bhat et al. |
| 2016/0035952 A1 | 2/2016 | Yamada et al. |
| 2016/0079496 A1 | 3/2016 | Huang et al. |
| 2016/0155900 A1 | 6/2016 | Bono et al. |
| 2016/0155915 A1 | 6/2016 | Ling et al. |
| 2016/0181476 A1 | 6/2016 | Chang et al. |
| 2016/0190406 A1 | 6/2016 | Liu et al. |

FOREIGN PATENT DOCUMENTS

| | | |
|---|---|---|
| CN | 1624944 B | 4/2010 |
| CN | 101855735 A | 10/2010 |
| CN | 101867003 A | 10/2010 |
| CN | 101878540 A | 11/2010 |
| CN | 101978516 A | 2/2011 |
| CN | 102074639 A | 5/2011 |

(56) References Cited

FOREIGN PATENT DOCUMENTS

| | | | |
|---|---|---|---|
| CN | 102130071 A | 7/2011 | |
| CN | 102132428 A | 7/2011 | |
| CN | 102214623 A | 10/2011 | |
| CN | 102222757 A | 10/2011 | |
| CN | 102263194 A | 11/2011 | |
| CN | 102290500 A | 12/2011 | |
| CN | 102347423 A | 2/2012 | |
| CN | 102468417 A | 5/2012 | |
| CN | 102738368 A | 10/2012 | |
| CN | 102804426 A | 11/2012 | |
| CN | 103022010 A | 4/2013 | |
| CN | 103050601 A | 4/2013 | |
| CN | 103137571 A | 6/2013 | |
| CN | 103403890 A | 11/2013 | |
| CN | 103531725 A | 1/2014 | |
| CN | 103534822 A | 1/2014 | |
| CN | 103682038 A | 3/2014 | |
| CN | 203774363 U | 8/2014 | |
| CN | 203910851 U | 10/2014 | |
| CN | 104253194 A | 12/2014 | |
| CN | 104347610 A | 2/2015 | |
| CN | 204155931 U | 2/2015 | |
| CN | 104521015 A | 4/2015 | |
| JP | 2012227470 A | 11/2012 | |
| TW | 200841089 A | 10/2008 | |
| TW | 200929615 A | 7/2009 | |
| TW | 201017934 A1 | 5/2010 | |
| TW | 201114072 A1 | 4/2011 | |
| TW | 201133956 A1 | 10/2011 | |
| TW | 201210819 A1 | 3/2012 | |
| TW | 201220534 A1 | 5/2012 | |
| TW | 201242108 A1 | 10/2012 | |
| TW | 201249898 A1 | 12/2012 | |
| TW | 201319460 A | 5/2013 | |
| TW | M453969 U | 5/2013 | |
| TW | 201507209 A | 2/2015 | |
| TW | 201515282 A | 4/2015 | |
| TW | 201541674 A | 11/2015 | |
| WO | 2011093454 A1 | 6/2013 | |

OTHER PUBLICATIONS

CN Office Action dated Apr. 20, 2018 in Chinese application (No. 201410362787.6).

CN Office Action dated Apr. 27, 2018 in Chinese application (No. 201510244596.4).

Non-Final Office Action issued in U.S. Appl. No. 15/908,779, filed Feb. 28, 2018, dated Apr. 4, 2018.

Non-Final Office Action issued in U.S. Appl. No. 15/959,534, filed Apr. 23, 2018, dated Jun. 21, 2018.

Non-Final Office Action issued in U.S. Appl. No. 15/657,299, filed Jul. 24, 2017, dated May 16, 2018.

Non-Final Office Action issued in U.S. Appl. No. 15/881,802, filed Jan. 29, 2018, dated Aug. 10, 2018.

Final Office Action issued in U.S. Appl. No. 15/657,299, filed Jul. 24, 2017, dated Oct. 2, 2018.

Non-Final Office Action issued in U.S. Appl. No. 15/787,811, filed Oct. 19, 2017, dated Oct. 18, 2018.

Non-Final Office Action issued in U.S. Appl. No. 16/004,445, filed Jun. 11, 2018, dated Sep. 27, 2018.

TIPO Office Action dated Oct. 5, 2018 in Taiwan application (No. 104131083).

TIPO Office Action dated Sep. 20, 2018 in Taiwan application (No. 104125226).

Chinese language office action dated Nov. 2, 2018, issued in application No. CN 201610156914.6.

Chinese language office action dated Nov. 1, 2018, issued in application No. CN 201610157140.9.

Office action dated Nov. 29, 2018, issued in U.S. Appl. No. 15/973,552.

TIPO Office Action dated Jan. 9, 2018 in Taiwan application (No. 106135995).

TIPO Office Action dated Jan. 16, 2018 in Taiwan application (No. 106131096).

Final Office Action issued in U.S. Appl. No. 15/045,471, filed Feb. 17, 2016, dated Feb. 22, 2017.

Non-Final Office Action issued in U.S. Appl. No. 15/045,471, filed Feb. 17, 2016, dated Oct. 25, 2016.

Non-Final Office Action issued in U.S. Appl. No. 15/073,707, filed Mar. 18, 2016, dated May 1, 2017.

Non-Final Office Action issued in U.S. Appl. No. 14/711,798, filed May 14, 2015, dated Dec. 16, 2016.

Non-Final Office Action issued in U.S. Appl. No. 15/073,672, filed Mar. 18, 2016, dated Mar. 10, 2017.

Non-Final Office Action issued in U.S. Appl. No. 15/073,673, filed Feb. 17, 2016, dated Mar. 31, 2017.

Non-Final Office Action issued in U.S. Appl. No. 15/168,218, filed May 30, 2016, dated Nov. 4, 2016.

SIPO Office Action dated May 22, 2017 in Chinese application (No. 201410362787.6).

TIPO Office Action dated Nov. 17, 2016 in corresponding Taiwan application (No. 104144809).

CN Office Action dated Nov. 28, 2018 in Chinese application (No. 201610156784.6).

CN Office Action dated Jan. 22, 2019 in Chinese application (No. 201610293182.5).

TIPO Office Action dated Dec. 6, 2018 in Taiwan application (No. 107119063).

CN Office Action dated Dec. 3, 2018 in Chinese application (No. 201610157182.2).

CN Office Action dated Dec. 4, 2018 in Chinese application (No. 201610089097.7).

CN Office Action dated Mar. 21, 2019 in Chinese application (No. 201610830051.6).

Non-Final Office Action issued in U.S. Appl. No. 15/823,480, filed Nov. 27, 2017, dated Dec. 31, 2018.

TIPO Office Action dated Jun. 18, 2019 in Taiwan application (No. 105108594).

Notice of Allowance issued in U.S. Appl. No. 15/823,480, filed Nov. 27, 2017, dated Apr. 12, 2019.

TIPO Office Action dated Jun. 11, 2018 in Taiwan application (No. 107117295).

TIPO Office Action dated Jun. 28, 2019 in Taiwan Application # 105104666, pp. 1-6.

CN Office Action dated Sep. 27, 2019 in Chinese application (No. 201610830051.6).

\* cited by examiner

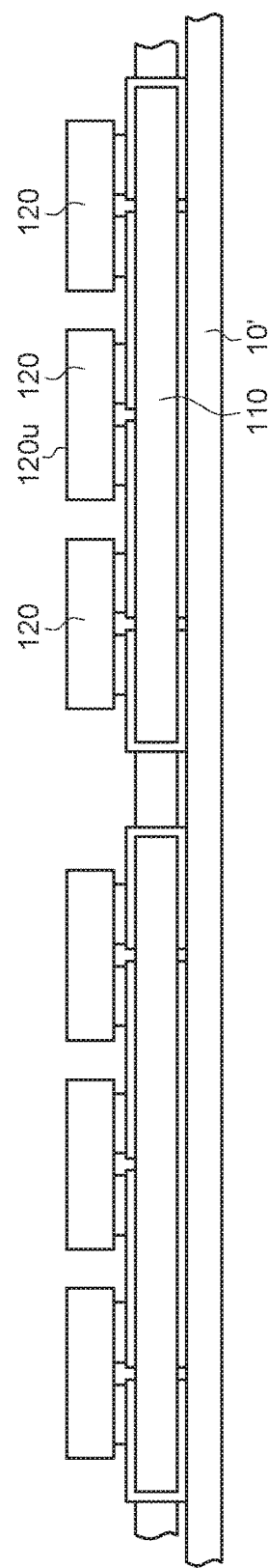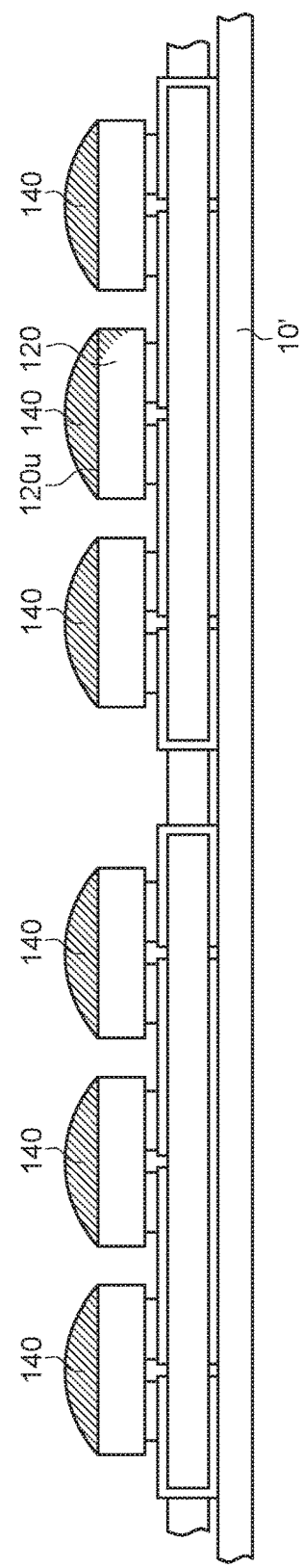

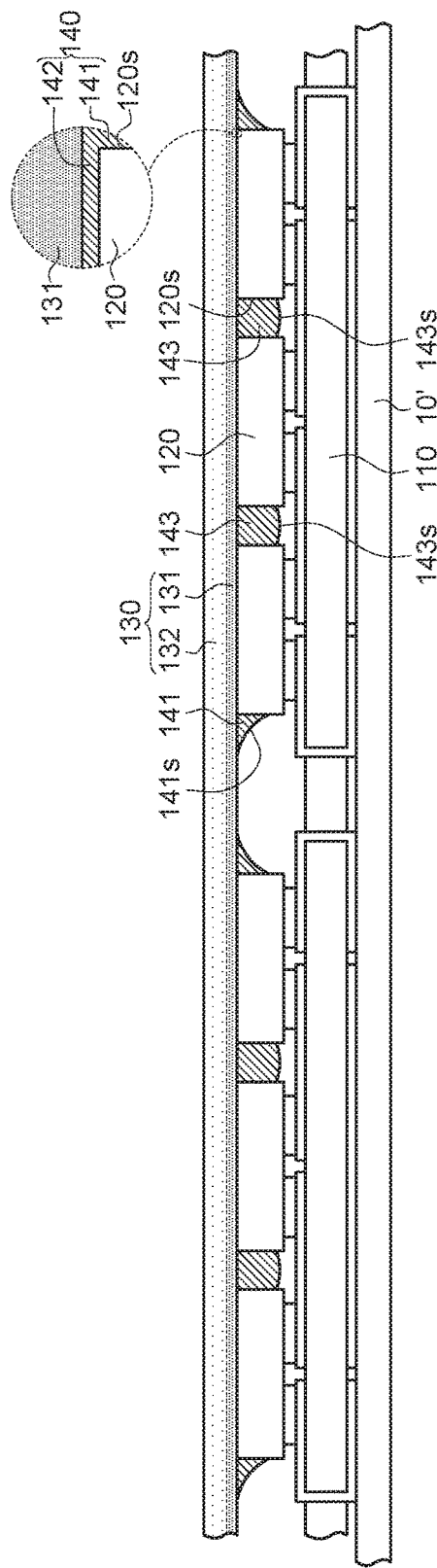
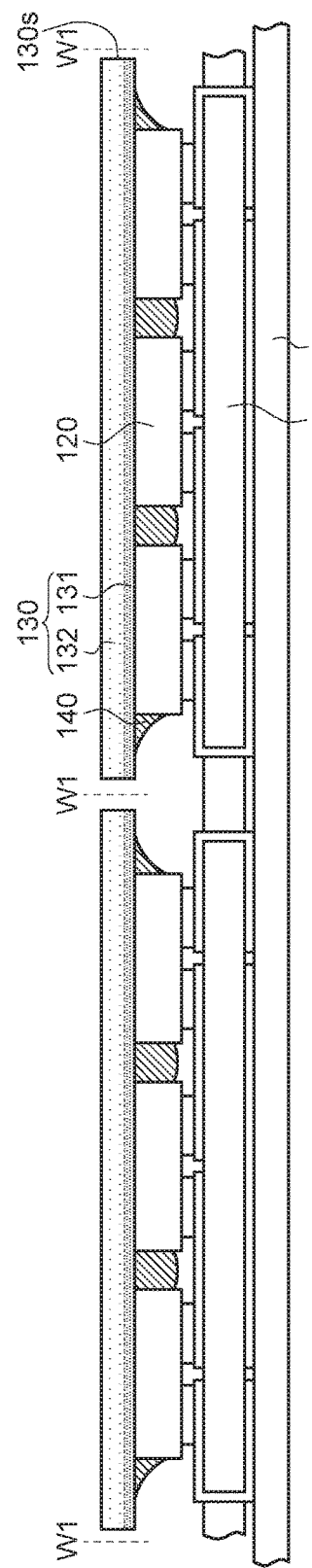
FIG. 9C
FIG. 9D

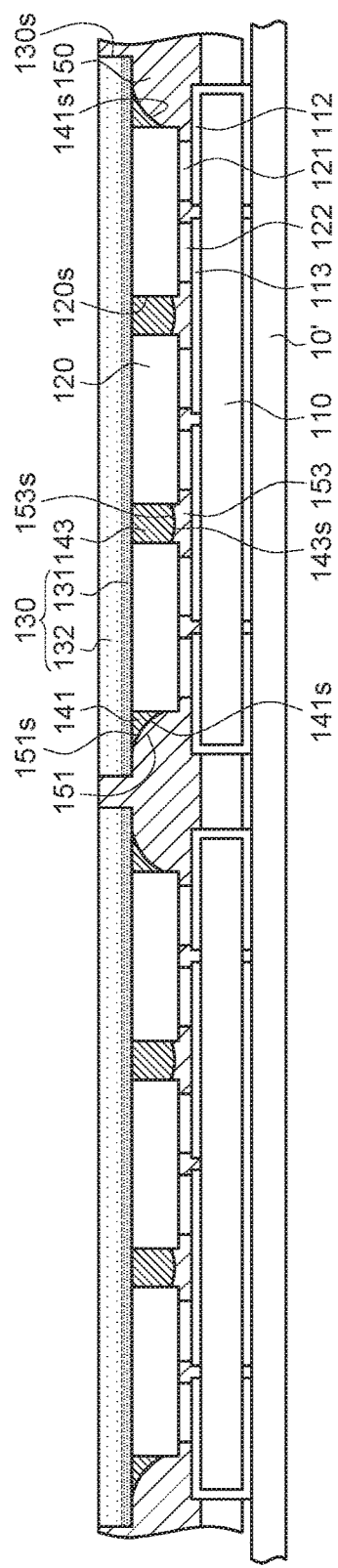
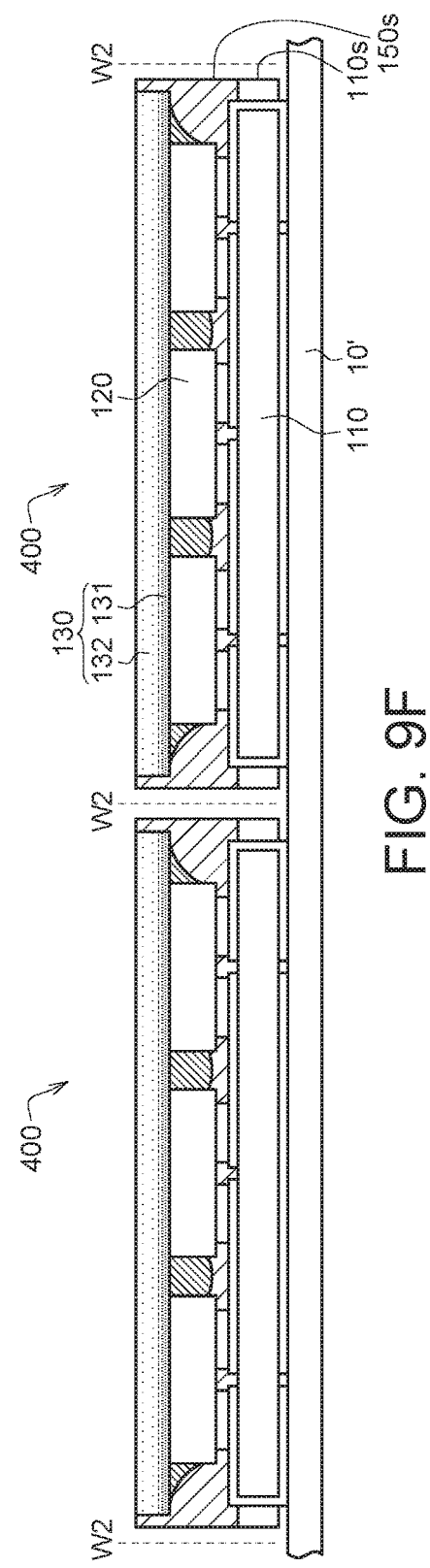
FIG. 9E
FIG. 9F

LIGHT-EMITTING DEVICE

This application is a continuation application of U.S. application Ser. No. 15/268,681, filed Sep. 19, 2016, now U.S. Pat. No. 9,922,963, which claims the benefit of U.S. provisional application Ser. No. 62/220,249, filed Sep. 18, 2015, the benefit of U.S. provisional application Ser. No. 62/241,729, filed Oct. 14, 2015 and the benefit of Taiwan application serial No. 104144809, filed Dec. 31, 2015, the contents of which are incorporated herein by references.

TECHNICAL FIELD

The disclosure relates in general to a light-emitting device, and more particularly to a light-emitting device having a reflective layer.

BACKGROUND

Conventional light-emitting device includes a phosphor glue and a light-emitting component, wherein the phosphor glue covers an upper surface and a lateral surface of the light-emitting component. The high temperature generated by the light-emitting component, when illuminating, will negatively affect the phosphor glue, speed up the deterioration of the phosphor glue and change the light color.

Therefore, it has become a prominent task for the industry to slow the deterioration of the phosphor glue.

SUMMARY

Thus, the disclosure provides a light-emitting device capable of relieving the deterioration of the phosphor glue.

According to one embodiment, a light-emitting device is provided. The light-emitting device includes a substrate, a light-emitting component, a wavelength conversion layer, an adhesive layer and a reflective layer. The light-emitting component is disposed on and electrically connected to the substrate and has a lateral surface and an upper surface. The wavelength conversion layer is disposed on the light-emitting component. The adhesive layer is disposed between the light-emitting component and the substrate and covers the upper surface of the light-emitting component and at least a portion of the lateral surface of the light-emitting component. The reflective layer is disposed above the substrate and at least surrounds the light-emitting component and the adhesive layer, wherein the reflective layer has an inclined reflective surface, the inclined reflective surface contacts a portion of the light-emitting component and being away from the light-emitting component in a direction of the substrate toward the wavelength conversion layer.

According to another embodiment, a light-emitting device is provided. The light-emitting device includes a substrate, a light-emitting component, a wavelength conversion layer and a reflective layer. The light-emitting component is disposed on and electrically connected to the substrate and has an upper surface. The wavelength conversion layer is disposed on the light-emitting component and at least covers the upper surface of the light-emitting component. The reflective layer is disposed above the substrate and surrounding the light-emitting component and the wavelength conversion layer, wherein the reflective layer has an inclined reflective surface, the inclined reflective surface contacts a portion of the light-emitting component and a portion of the wavelength conversion layer, and the inclined reflective surface is away from the light-emitting component in a direction of the substrate toward the wavelength conversion layer.

According to another embodiment, a light-emitting device is provided. The light-emitting device includes a substrate, a light-emitting component, a wavelength conversion layer, an adhesive layer and a reflective layer. The light-emitting component is disposed on and electrically connected to the substrate and has a lateral surface and an upper surface. The wavelength conversion layer is disposed on the light-emitting component. The adhesive layer is disposed between the light-emitting component and the substrate and covers the upper surface of the light-emitting component and at least a portion of the lateral surface of the light-emitting component. The reflective layer is disposed above the substrate and surrounds the light-emitting component, the adhesive layer and the wavelength conversion layer, wherein the reflective layer has an inclined reflective surface, the inclined reflective surface contacts a portion of the light-emitting component and a portion of the wavelength conversion layer, and the inclined reflective surface is away from the light-emitting component in a direction of the substrate toward the wavelength conversion layer. The light-emitting device has a flat lateral surface including the reflective layer and the substrate.

The above and other aspects of the invention will become better understood with regard to the following detailed description of the preferred but non-limiting embodiment (s). The following description is made with reference to the accompanying drawings.

BRIEF DESCRIPTION OF THE DRAWINGS

FIGS. 9A to 9F illustrate manufacturing processes of the light-emitting device of FIG. 4.

DETAILED DESCRIPTION

Figure 1:
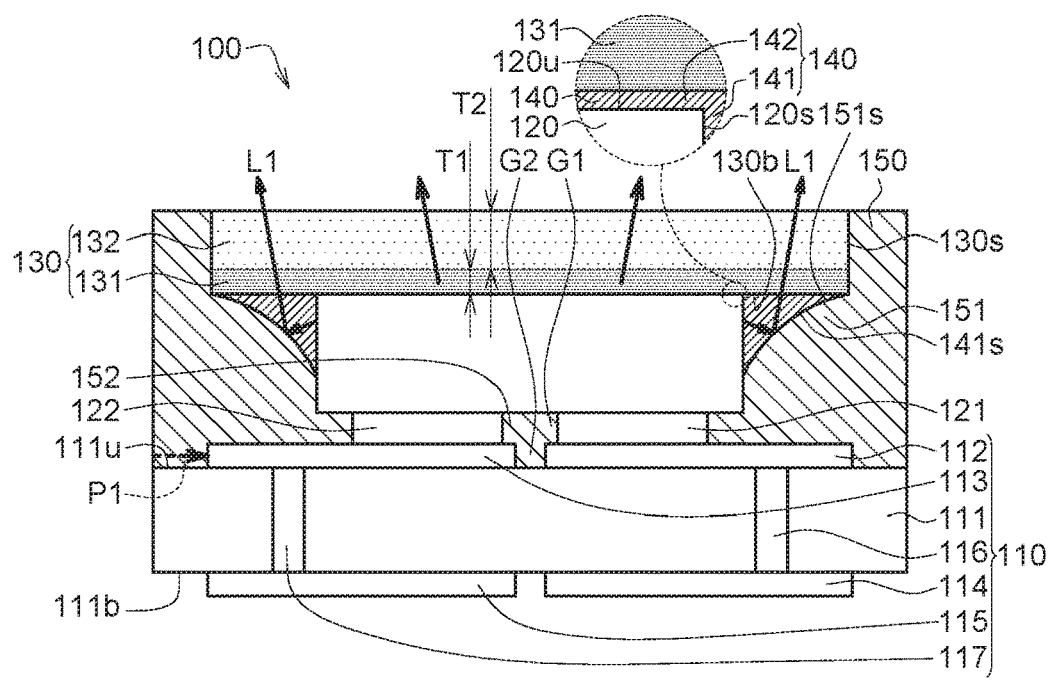
FIG. 1 illustrates a cross-sectional view of a light-emitting device according to an embodiment of the invention.

FIG. 1 illustrates a cross-sectional view of a light-emitting device 100 according to an embodiment of the invention. The light-emitting device 100 includes a substrate 110, a light-emitting component 120, a wavelength conversion layer 130, an adhesive layer 140 and a reflective layer 150.

The substrate 110 is, for example, a ceramic substrate. In the present embodiment, the substrate 110 includes a base 111, a third electrode 112, a fourth electrode 113, a first pad 114, a second pad 115, a first conductive pillar 116 and a second conductive pillar 117.

The base 111 is made of a material such as silicon-based material. The base 111 has a first surface 111$u$ and a second surface 111$b$ opposite to the first surface 111$u$. The third electrode 112 and the fourth electrode 113 are formed on the first surface 111u of the base 111, and the first pad 114 and the second pad 115 are formed on the second surface 111b of the base 111. The first conductive pillar 116 and the second conductive pillar 117 pass through the base 111, wherein the first conductive pillar 116 connects the third electrode 112 to the first pad 114 for electrically connecting the third electrode 112 to the first pad 114, and the second conductive pillar 117 connects the fourth electrode 113 to the second pad 115 for electrically connecting the fourth electrode 113 to the second pad 115.

The light-emitting device 100 may be disposed on a circuit board (not illustrated), wherein the first pad 114 and the second pad 115 of the substrate 110 are electrically connected to two electrodes (not illustrated) of the circuit board, such that the light-emitting component 120 is electrically connected to the circuit board through the first pad 114 and the second pad 115.

The light-emitting component 120 is disposed on the substrate 110. The light-emitting component 120 includes a first electrode 121 and a second electrode 122, wherein the first electrode 121 and the second electrode 122 are electrically connected to the third electrode 112 and the fourth electrode 113 respectively.

The light-emitting component 120 is, for example, a light-emitting diode. Although not illustrated, the light-emitting component 120 may further comprise a first type semiconductor layer, a second type semiconductor layer and a light emitting layer, wherein the light emitting layer is formed between the first type semiconductor layer and the second type semiconductor layer. The first type semiconductor layer is realized by such as an N-type semiconductor layer, and the second type semiconductor layer is realized by such as a P-type semiconductor layer. Alternatively, the first type semiconductor layer is realized by such as a P-type semiconductor layer, and the second type semiconductor layer is realized by such as an N-type semiconductor layer. The P-type semiconductor is realized by a GaN-based semiconductor doped with trivalent elements such as a gallium nitride based semiconductor layer which is doped with Beryllium (Be), zinc (Zn), manganese (Mn), chromium (Cr), magnesium (Mg), calcium (Ca), etc. The N-type semiconductor is realized by a GaN-based semiconductor doped with doped with silicon (Si), germanium (Ge), tin (Sn), sulfur (S), oxygen (O), titanium (Ti) and or zirconium (Zr), etc. The light emitting layer 122 may be realized by a structure of $In_xAl_yGa_{1-x-y}N$ ($0 \leq x$, $0 \leq y$, $x+y \leq 1$) or a structure which is doped with Boron (B), phosphorus (P) or arsenic (As). In addition, the light emitting layer 122 may be a single-layered structure or multi-layered structure.

The first electrode 121 may be realized by a single-layered structure or a multi-layered structure which is made of at least one of materials including gold, aluminum, silver, copper, rhodium (Rh), ruthenium (Ru), palladium (Pd), iridium (Ir), platinum (Pt), chromium, tin, nickel, titanium, tungsten (W), chromium alloys, titanium tungsten alloys, nickel alloys, copper silicon alloy, aluminum silicon copper alloy, aluminum silicon alloy, gold tin alloy, but is not limited thereto. The second electrode 122 may be realized by a single-layered structure or a multi-layered structure. The second electrode 122 may be made of a material similar to that of the first electrode 121.

The wavelength conversion layer 130 includes a high-density phosphor layer 131 and a low-density phosphor layer 132. The wavelength conversion layer 130 includes a plurality of phosphor particles, wherein a region whose phosphor particle density is higher is defined as the high-density phosphor layer 131, and a region whose phosphor particle density is lower is defined as the low-density phosphor layer 132. In an embodiment, a ratio of a phosphor particle density of the high-density phosphor layer 131 and a phosphor particle density of the low-density phosphor layer 132 ranges between 1 and $10^{15}$, wherein the range may contain or may not contain 1 and $10^{15}$.

In the present embodiment, the high-density phosphor layer 131 is located between the light-emitting component 120 and the low-density phosphor layer 132. That is, the light emitted from the light-emitting component 120 first passes through the high-density phosphor layer 131, and then is emitted out of the wavelength conversion layer 130 through the low-density phosphor layer 132. Due the design of the high-density phosphor layer 131, the light color of the light-emitting device 100 can be collectively distributed in the chromaticity coordinate. As a result, the yield of the light-emitting device 100 may be increased. The low-density phosphor layer 132 may increase a light mixing probability. In detail, for the light L1 which has not contacted the phosphor particles within the high-density phosphor layer 131 yet, the low-density phosphor layer 132 increases the probability of the light L1 contacting the phosphor particles. In the present embodiment, a thickness T2 of the low-density phosphor layer 132 is larger than a thickness T1 of the high-density phosphor layer 131, and accordingly the light mixing probability of the light L1 of the light-emitting component 120 can be further increased. In an embodiment, a ratio of the thickness T2 and the thickness T1 ranges between 1 and 1000, wherein the range may contain or may not contain 1 and 1000.

The wavelength conversion layer 130 covers the entire upper surface 120u of the light-emitting component 120. That is, in the present embodiment, the area of the wavelength conversion layer 130 viewed from the top view is larger than the area of the light-emitting component 120 viewed from the top view. In an embodiment, a ratio of the area of the wavelength conversion layer 130 viewed from the top view and the area of the light-emitting component 120 viewed from the top view ranges between 1 and 1.35, however less than 1 or larger than 1.35 is also feasible.

In an embodiment, the wavelength conversion layer 130 may be made of a material including sulfide, Yttrium aluminum garnet (YAG), LuAG, silicate, nitride, oxynitride, fluoride, TAG, KSF, KTF, etc.

The adhesive layer 140 is, for example, a transparent adhesive. The adhesive layer 140 includes a first lateral portion 141 and a heat resistance layer 142. The first lateral portion 141 covers a portion of a lateral surface 120s of the light-emitting component 120, and another portion or the other portion of the lateral surface 120s of the light-emitting component 120 is covered by the reflective layer 150. Viewed from the direction of the top view of FIG. 1, the first lateral portion 141 is shaped into a closed ring shape which surrounds the entire lateral surface 120s of the light-emitting component 120. In another embodiment, the first lateral portion 141 may be shaped into an open ring shape.

As illustrated in an enlargement view of FIG. 1, the heat resistance layer 142 of the adhesive layer 140 is formed between the high-density phosphor layer 131 and the light-emitting component 120, and accordingly it can increase the heat resistance between the light-emitting component 120 and the wavelength conversion layer 130 to slows the degrading speed of the wavelength conversion layer 130. In detail, if the heat generated from the light-emitting component 120 is easily transmitted to the wavelength conversion layer 130, it will speed up the deterioration of the phosphor particles within the wavelength conversion layer 130. In the present embodiment, due to the forming of the heat resistance layer 142, the heat transmitted to the wavelength conversion layer 130 can be decreased, and accordingly it can slow the deterioration of the phosphor particles within the wavelength conversion layer 130. In an embodiment, the thickness of the heat resistance layer 142 may range between 1 and 1000, wherein the range may contain or may not contain 1 and 1000.

The reflective layer 150 is formed above the substrate 110 and covers the lateral surface 120s of the light-emitting component 120, a lateral surface 141s of the first lateral portion 141 of the adhesive layer 140 and a lateral surface 130s of the wavelength conversion layer 130, and accordingly it can advantageously protect the light-emitting component 120 and the wavelength conversion layer 130 from being exposed to be damaged. The reflective layer 150 may reflect the light L1 emitted from the lateral surface 120s of the light-emitting component 120 to the wavelength conversion layer 130, and accordingly it can increase the luminous efficiency of the light-emitting device 100.

As illustrated in FIG. 1, the reflective layer 150 further covers a lateral surface of the first electrode 121, a lateral surface of the second electrode 122, a lateral surface of the third electrode 112 and a lateral surface of the fourth electrode 113. As a result, it can prevent the first electrode 121, the second electrode 122, the third electrode 112 and the fourth electrode 113 from being exposed and damaged by the environment, such as oxidation, humidity, etc.

There is a first gap G1 between the first electrode 121 and the second electrode 122, and there is a second gap G2 between the third electrode 112 and the fourth electrode 113. The reflective layer 150 includes a filling portion 152, and the first gap G1 and/or the second gap G2 is led with the filling portion 152.

The reflective layer 150 includes a first reflective portion 151 which surrounds the lateral surface 120s of the light-emitting component 120. The first reflective portion 151 has a first reflective surface 151s facing the lateral surface 120s of the light-emitting component 120 and/or the wavelength conversion layer 130 for reflecting the light L1 emitted from the lateral surface 120s of the light-emitting component 120 to the wavelength conversion layer 130. In the present embodiment, the first reflective surface 151s is a convex surface facing the lateral surface 120s of the light-emitting component 120 and/or the wavelength conversion layer 130. In another embodiment, the first reflective surface 151s may be a concave surface.

As illustrated in FIG. 1, the convex first reflective surface 151s connects a lower surface 130b of the wavelength conversion layer 130 to the lateral surface 120s of the light-emitting component 120. As a result, it can increase the probability of the light L1 emitted from the light-emitting component 120 contacting the convex surface, such that the light L1 emitted from the light-emitting component 120 almost or completely is reflected by the reflective layer 150 to the wavelength conversion layer 130 and then is emitted out of the light-emitting device 100, and accordingly it can increase the luminous efficiency of the light-emitting device 100.

In an embodiment, the reflective layer 150 has a reflectivity larger than 90%. The reflective layer 150 may be made of a material including Poly phthalic amide (PPA), polyamide (PA), polyethylene terephthalate (PTT), polyethylene terephthalate (PET), polyethylene terephthalate 1,4-cyclohexane dimethylene terephthalate (POT), epoxy compound (EMC), silicone compound (SMC) or other resin/ceramic material having high reflectivity. In addition, the reflective layer 150 may be a white glue.

As described above, in comparison with the conventional light-emitting device, the luminous area of the light-emitting device 100 can increase by 40% and the brightness of the light-emitting device 100 can increase by 15%.

Figure 2:
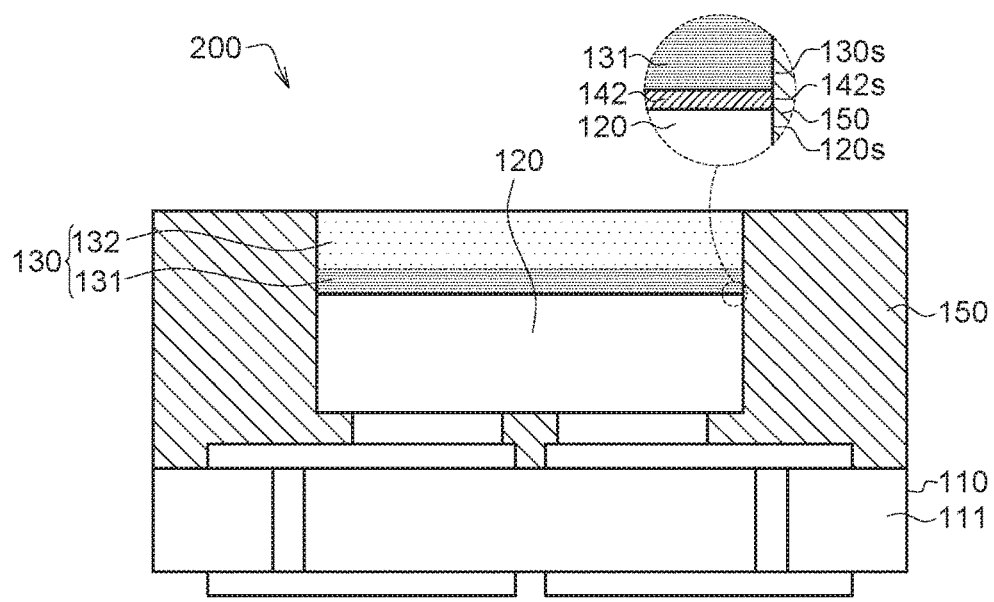
FIG. 2 illustrates a cross sectional view of a light-emitting device according to another embodiment of the invention.

FIG. 2 illustrates a cross sectional view of a light-emitting device 200 according to another embodiment of the invention. The light-emitting device 200 includes the substrate 110, the light-emitting component 120, the wavelength conversion layer 130, the adhesive layer 140 and the reflective layer 150.

In comparison with the light-emitting device 100, the top-viewed area of the wavelength conversion layer 130 of the light-emitting device 200 is substantially equal to the top-viewed area of the light-emitting component 120 of the light-emitting device 200, that is, the ratio of the top-viewed area of the wavelength conversion layer 130 and the top-viewed area of the light-emitting component 120 is about 1. Due the first lateral portion 141 of the adhesive layer 140 being removed, the entire lateral surface 120s of the light-emitting component 120 and the entire lateral surface 142s of the heat resistance layer 142 of the adhesive layer 140 are exposed, and accordingly the entire lateral surface 120s of the light-emitting component 120 and the entire lateral surface 142s of the heat resistance layer 142 of the adhesive layer 140 can be covered by the reflective layer 150. Furthermore, since the lateral surface 120s of the light-emitting component 120, the lateral surface 130s of the wavelength conversion layer 130 and the lateral surface 142s of the heat resistance layer 142 of the adhesive layer 140 can be formed in the same singulation process, the lateral surface 120s, the lateral surface 130s and the lateral surface 142s are substantially aligned or flush with each other.

Figure 3:
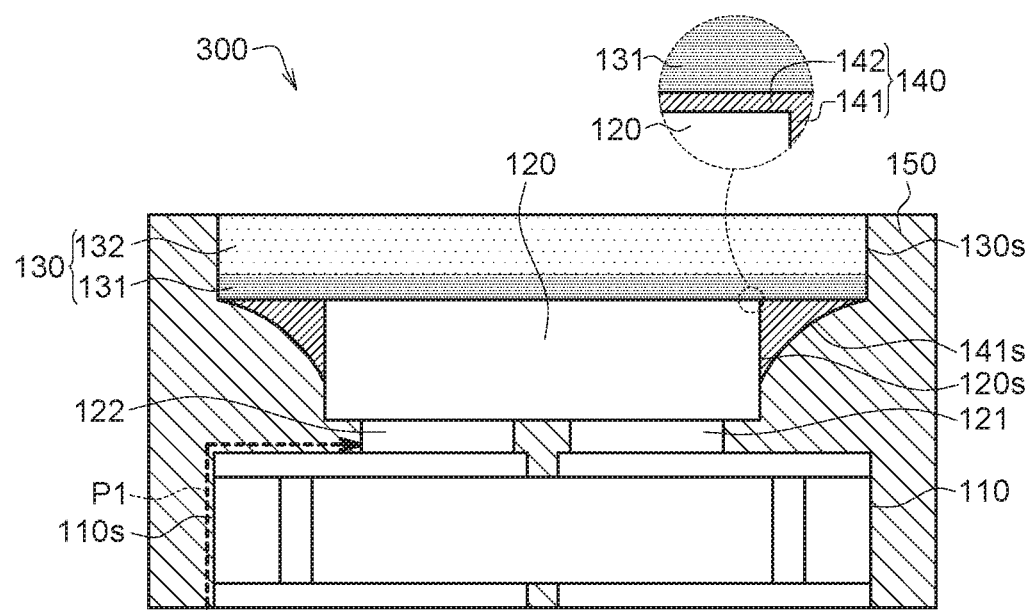
FIG. 3 illustrates a cross sectional view of a light-emitting device according to another embodiment of the invention.

FIG. 3 illustrates a cross sectional view of a light-emitting device 300 according to another embodiment of the invention. The light-emitting device 300 includes the substrate 110, the light-emitting component 120, the wavelength conversion layer 130, the adhesive layer 140 and the reflective layer 150.

In comparison with the light-emitting device 100, the reflective layer 150 of the light-emitting device 300 further covers a lateral surface 110s of the substrate 110, and accordingly it can prevent or reduce the damage by the exterior environmental factors (such as air, water, gas, etc.) through the lateral surface 110s of the substrate 110. Furthermore, due to the reflective layer 150 covering the lateral surface 110s of the substrate 110, it can increase a length of a path P1 from the exterior environmental to the electrode (the first electrode 121 and/or the second electrode 122) of the light-emitting component 120 (in comparison with the path P1 of FIG. 1, the length of the path P1 of the present embodiment is longer), and accordingly it can reduce the probability of the light-emitting component 120 being damaged by the environmental factors for increasing the reliability and life of the light-emitting device 300.

In another embodiment, the top-viewed area of the wavelength conversion layer 130 of the light-emitting device 300 is substantially equal to the top-viewed area of the light-emitting component 120. Such structure is similar to the structure of the light-emitting device 200, and the similarities are not repeated.

Figure 4:
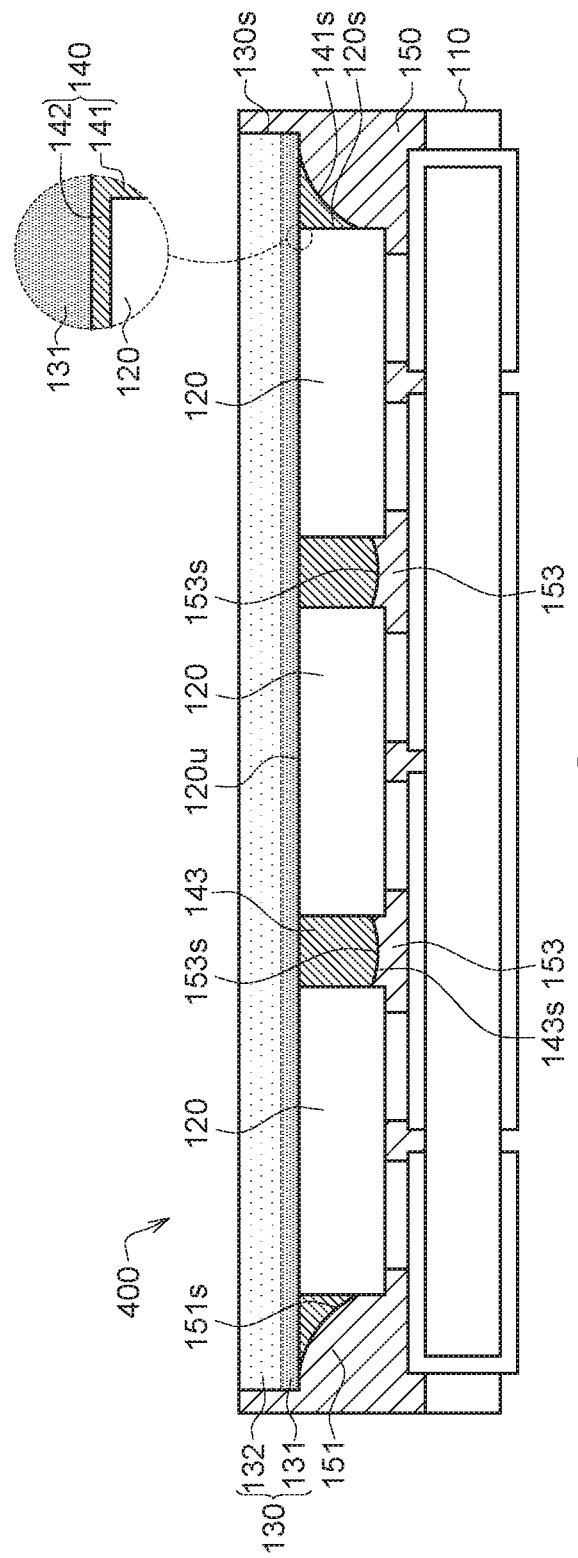
FIG. 4 illustrates a cross sectional view of a light-emitting device according to another embodiment of the invention.

FIG. 4 illustrates a cross sectional view of a light-emitting device 400 according to another embodiment of the invention. The light-emitting device 400 includes the substrate 110, a plurality of the light-emitting components 120, the wavelength conversion layer 130, the adhesive layer 140 and the reflective layer 150. The light-emitting components 120 are disposed on the substrate 110. The adhesive layer 140 covers at least a portion of the lateral surface 120s of each light-emitting component 120.

In comparison with the aforementioned light-emitting device, a portion of the adhesive layer 140 of the light-emitting device 400 is further formed between adjacent two light-emitting components 120. For example, the adhesive layer 140 further includes a second lateral portion 143 located between two light-emitting components 120, and the second lateral portion 143 has a lower surface 143s, wherein the lower surface 143s is a convex surface or a concave surface. The reflective layer 150 is formed between adjacent two light-emitting components 120. For example, the reflective layer 150 further includes a second reflective portion 153, wherein the second reflective portion 153 is located between adjacent two light-emitting components 120. The second reflective portion 153 has a second reflective surface 153s complying with the lower surface 143s, and accordingly the second reflective surface 153s is a concave surface. In another embodiment, the lower surface 143s may be a concave surface, and the second reflective surface 153s is a convex surface. The second reflective surface 153s may reflect the light L1 emitted by the light-emitting component 120 to the wavelength conversion layer 130, and accordingly it can increase the luminous efficiency of the light-emitting device 400.

In another embodiment, the reflective layer 150 of the light-emitting device 400 may further cover the lateral surface 110s of the substrate 110s. Such structure is similar to the structure of the light-emitting device 300, and the similarities are not repeated.

In another embodiment, the top-viewed area of the wavelength conversion layer 130 of the light-emitting device 400 is substantially equal to the top-viewed area of the light-emitting component 120. Such structure is similar to the structure of the light-emitting device 200, and the similarities are not repeated.

FIGS. 5A to 5H illustrate manufacturing processes of the light-emitting device 100 of FIG. 1.

Figure 5A:
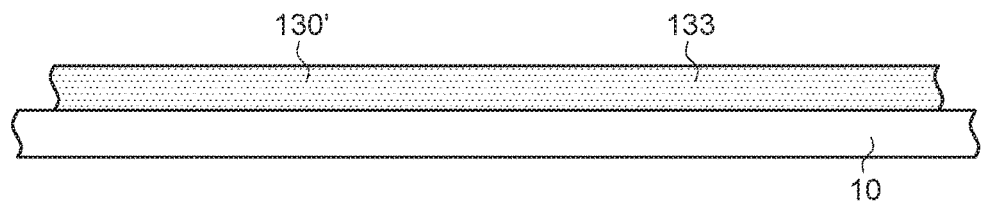
FIGS. 5A to 5H illustrate manufacturing processes of the light-emitting device of FIG. 1.

As illustrated in FIG. 5A, a wavelength conversion resin 130' is formed on a carrier 10 by way of, for example, dispensing. The wavelength conversion resin 130' contains a plurality of the phosphor particles 133. The polarity of the carrier 10 and the polarity of the wavelength conversion resin 130' are different, and accordingly the wavelength conversion resin 130' and the carrier 10 may be easily detached. In addition, although not illustrated, the carrier 10 may include a double-sided adhesive layer and a carrier plate, wherein the double-sided adhesive layer is adhered to the carrier plate for carrying the wavelength conversion resin 130'.

Figure 5B:
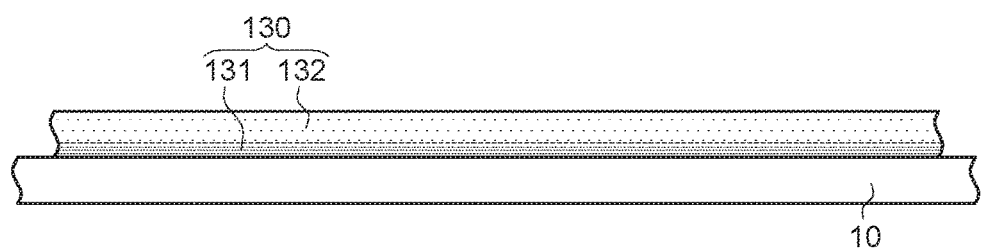

As illustrated in FIG. 5B, after the wavelength conversion resin 130' is stood for a period such as 24 hours, most of the phosphor particles 133 precipitate on a bottom of the wavelength conversion resin 130' to form the high-density phosphor layer 131, wherein the other of the phosphor particles 133 are distributed within the other portion of the wavelength conversion layer material 130' to form the low-density phosphor layer 132. The high-density phosphor layer 131 and the low-density phosphor layer 132 form the wavelength conversion layer 130.

Then, the wavelength conversion layer 130 is cured. As a result, the positions of the phosphor particles 133 can be fixed, and accordingly it can prevent the density distribution of the phosphor particles 133 within the wavelength conversion layer 130 from being easily changed.

Then, the carrier 10 and the wavelength conversion layer 130 are separated to expose the high-density phosphor layer 131 of the wavelength conversion layer 130.

Figure 5C:
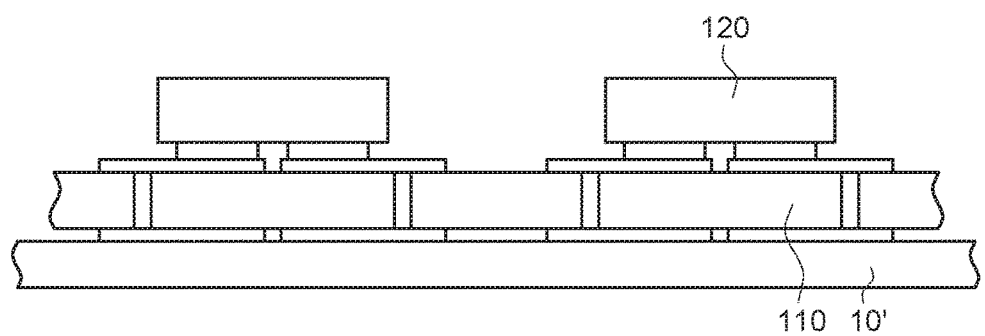

As illustrated in FIG. 5C, the substrate 110 and at least one light-emitting component 120 are provided, wherein the light-emitting component 120 is disposed on the substrate 110. In addition, the substrate 110 may be disposed on another carrier 10', wherein the carrier 10' has a structure similar to that of the carrier 10, and the similarities are not repeated.

Then, the high-density phosphor layer 131 of the wavelength conversion layer 130 is adhered to the light-emitting component 120 by the adhesive layer 140. The following description will be made with reference to the accompanying drawings.

Figure 5D:
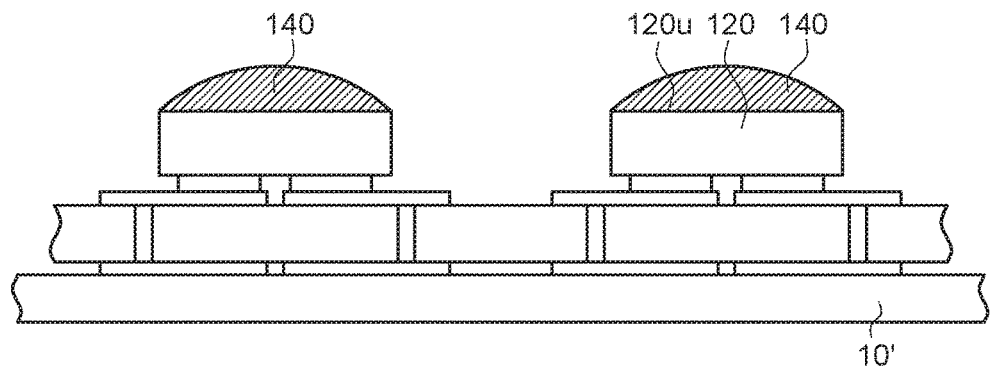

As illustrated in FIG. 5D, the adhesive layer 140 is formed on the upper surface 120u of the light-emitting component 120 by way of, for example, applying or dispensing.

Figure 5E:
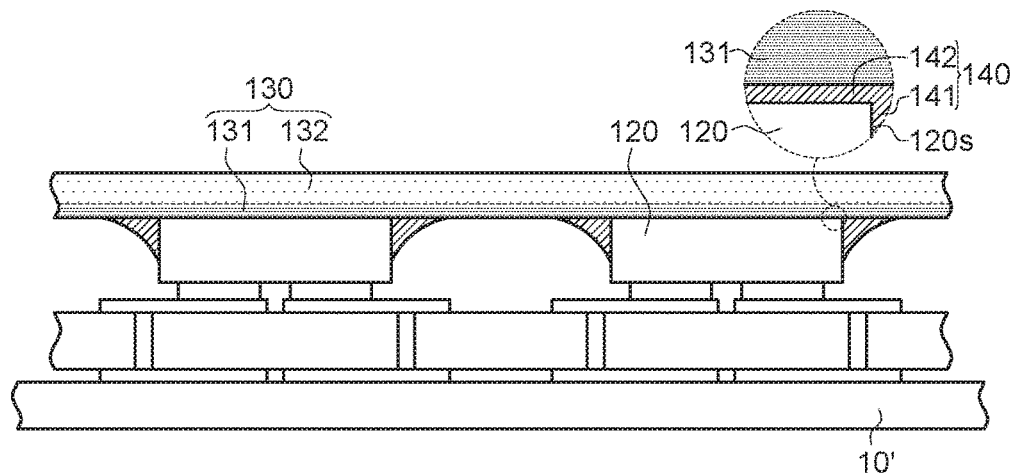

As illustrated in FIG. 5E, the wavelength conversion layer 130 is disposed on the adhesive layer 140, such that the adhesive layer 140 adheres the light-emitting component 120 to the high-density phosphor layer 131 of the wavelength conversion layer 130. Since the wavelength conversion layer 130 extrudes the adhesive layer 140, the adhesive layer 140 flow toward two sides of the light-emitting component 120 to form the first lateral portion 141. Due to surface tension, the lateral surface 141s of the first lateral portion 141 forms a concave surface. Depending on the amount of the adhesive layer 140 and/or the property of the adhesive layer 140, the lateral surface 141s may form a convex surface. In addition, depending on the amount of the adhesive layer 140 and/or the property of the adhesive layer 140, the first lateral portion 141 may cover at least a portion of the lateral surface 120s of the light-emitting component 120.

As illustrated in an enlargement view of FIG. 5E, a portion of the adhesive layer 140 which remains on between the wavelength conversion layer 130 and the light-emitting component 120 forms the heat resistance layer 142. The heat resistance layer 142 may reduce the heat of transmitting to the wavelength conversion layer 130 from the light-emitting component 120, and accordingly it can slow the degrading speed of the wavelength conversion layer 130.

Figure 5F:
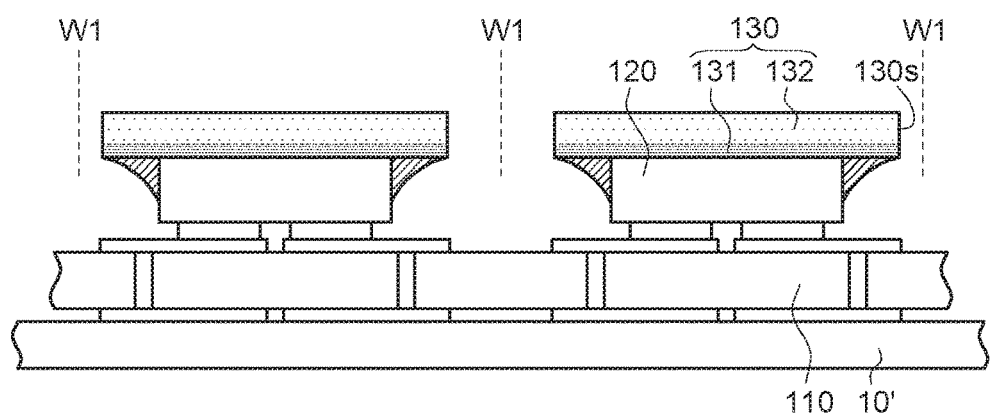

As illustrated in FIG. 5F, at least one first singulation path W1 passing through the wavelength conversion layer 130 is formed to cut off the wavelength conversion layer 130. In the present embodiment, the first singulation path W1 does not pass through the first lateral portion 141 of the adhesive layer 140. In another embodiment, the first singulation path W1 may pass through a portion of the first lateral portion 141. The lateral surface 130s of the wavelength conversion layer 130 is formed by the first singulation path W1, wherein the lateral surface 130s may be a plane or a curved surface.

The cutting width for forming the first singulation path W1 may be substantially equal to the width of the first singulation path W1. Alternatively, after the first singulation path W1 is formed, the double-sided adhesive layer (not illustrated) disposed on the carrier 10' may be stretched to increase an interval between adjacent two light-emitting components 120. Under such design, the first singulation path W1 may be formed using a thin blade.

Figure 5G:
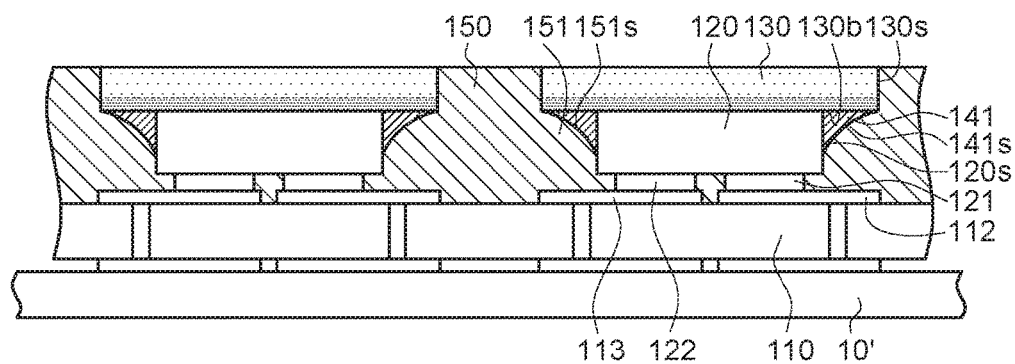

As illustrated in FIG. 5G, the fluid reflective layer 150 is formed above the substrate 110 by way of, for example, compression molding, wherein the reflective layer 150 covers a portion of the lateral surface 120s of the light-emitting component 120, the lateral surface 130s of the wavelength conversion layer 130, the lateral surface 141s of the first lateral portion 141 of the adhesive layer 140, the lateral surface of the third electrode 112 of the substrate 110, the lateral surface of the fourth electrode 113 of the substrate 110, the lateral surface of the first electrode 121 of the light-emitting component 120 and the lateral surface of the second electrode 122 of the light-emitting component 120.

In addition, the reflective layer 150 includes the first reflective portion 151 surrounding the entire lateral surface 120s of the light-emitting component 120. The first reflective portion 151 has the first reflective surface 151s. Due to the lateral surface 141s of the adhesive layer 140 being a concave surface, the first reflective surface 151s covering the lateral surface 141s is a convex surface facing the wavelength conversion layer 130 and the light-emitting component 120. The convex first reflective surface 151s can reflect the light L1 emitted from the lateral surface 120S to the wavelength conversion layer 130, and accordingly it can increase the luminous efficiency of the light-emitting device 100.

Since the first singulation path W1 of FIG. 5F does not pass through the first lateral portion 141 of the adhesive layer 140, the first reflective surface 151s of the reflective layer 150 can contact the lower surface 130b of the wavelength conversion layer 130. As a result, the convex first reflective surface 151s connects the lower surface 130b of the wavelength conversion layer 130 to the lateral surface 120s of the light-emitting component 120, and accordingly it can increase the contacting area of the light L1 emitted from the light-emitting component 120 and the convex surface (the first reflective surface 151s).

Then, the reflective layer 150 is cured by way of heating.

Figure 5H:
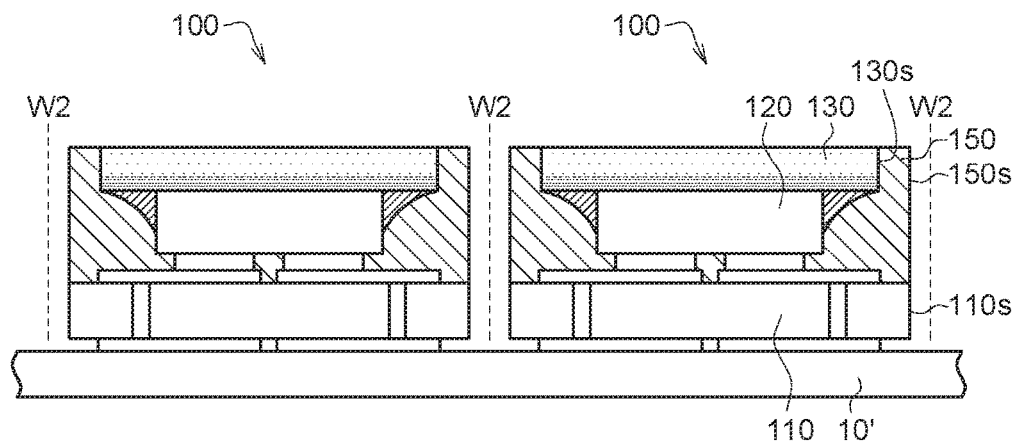

As illustrated in FIG. 5H, at least one second singulation path W2 passing through the reflective layer 150 and the substrate 110 is formed to form the light-emitting device 100 of FIG. 1. The first reflective surface 151s of the reflective layer 150 and the lateral surface 110s of the substrate 110 are formed by the second singulation path W2, wherein the first reflective surface 151s and the lateral surface 110s are substantially aligned or flush with each other.

In another embodiment, the second singulation path W2 may pass through the wavelength conversion layer 130, the reflective layer 150 and the substrate 110, such that the wavelength conversion layer 130, the reflective layer 150 and the substrate 110 form the lateral surface 130s, the lateral surface 150s and lateral surface 110s respectively, wherein the lateral surface 130s, the lateral surface 150s and lateral surface 110s are substantially aligned or flush with each other.

In addition, the cutting width for forming the second singulation path W2 may be substantially equal to the width of the second singulation path W2. Alternatively, after the second singulation path W2 is formed, the double-sided adhesive layer (not illustrated) disposed on the carrier 10' may be stretched to increase an interval between adjacent two light-emitting components 120. Under such design, the second singulation path W2 may be formed using a thin blade.

Figure 6A:
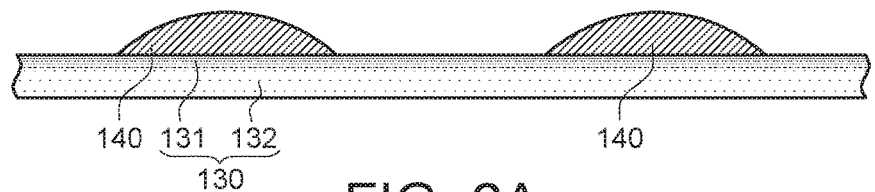
FIGS. 6A to 6C illustrate another manufacturing processes of the light-emitting device of FIG. 1.

FIGS. 6A to 6O illustrate another manufacturing processes of the light-emitting device 100 of FIG. 1.

As illustrated in FIG. 6A, the adhesive layer 140 is formed on the high-density phosphor layer 131 of the wavelength conversion layer 130 by way of, for example, applying or dispensing.

Figure 6B:
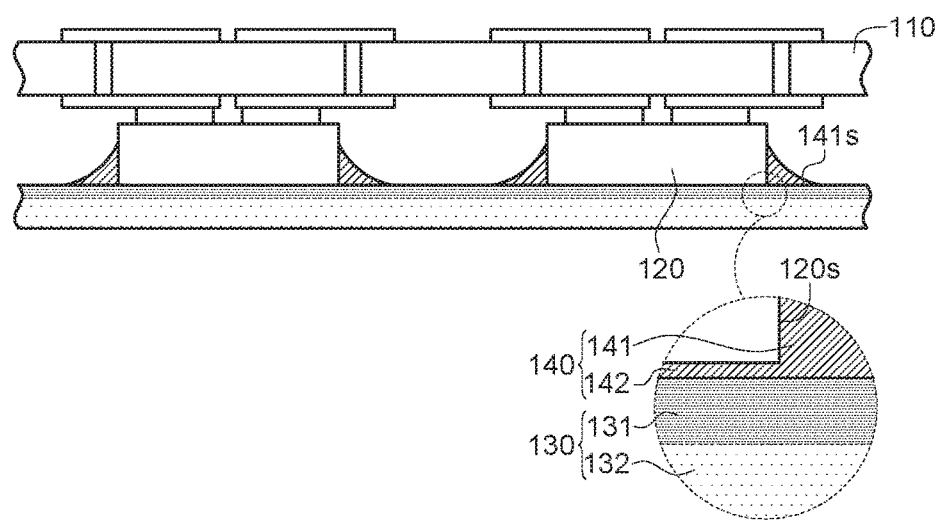

As illustrated in FIG. 6B, the substrate 110 and the light-emitting component 120 of FIG. 5O are disposed on the adhesive layer 140, wherein the light-emitting component 120 contacts with the adhesive layer 140, such that the adhesive layer 140 adheres the light-emitting component 120 to the high-density phosphor layer 131 of the wavelength conversion layer 130.

Due to the light-emitting component 120 extruding the adhesive layer 140, the adhesive layer 140 flows toward two sides of the light-emitting component 120 to form the first lateral portion 141. Due to surface tension, the lateral surface 141s of the first lateral portion 141 forms a concave surface. Depending on the amount of the adhesive layer 140 and/or the property of the adhesive layer 140, the first lateral portion 141 may cover at least a portion of the lateral surface 120s of the light-emitting component 120. In addition, as illustrated in an enlargement view of FIG. 6B, a portion of the adhesive layer 140 which remains on between the wavelength conversion layer 130 and the light-emitting component 120 forms the heat resistance layer 142. The heat resistance layer 142 may reduce the heat of transmitting to the wavelength conversion layer 130 from the light-emitting component 120, and accordingly it can slow the degrading speed of the wavelength conversion layer 130.

As illustrated in FIG. 6O, the light-emitting components 120, the wavelength conversion layer 130 and the substrate 110 are inverted, such that the wavelength conversion layer 130 faces upwardly.

The following steps are similar the corresponding steps of FIGS. 5A to 5H, and the similarities are not repeated.

Figure 7A:
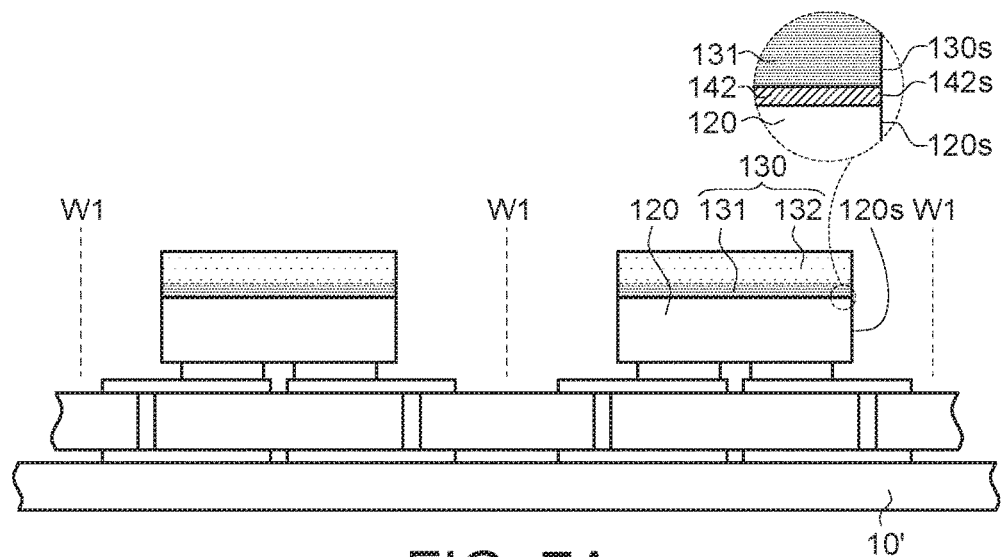
FIGS. 7A to 7C illustrate manufacturing processes of the light-emitting device of FIG. 2.
Figure 7B:
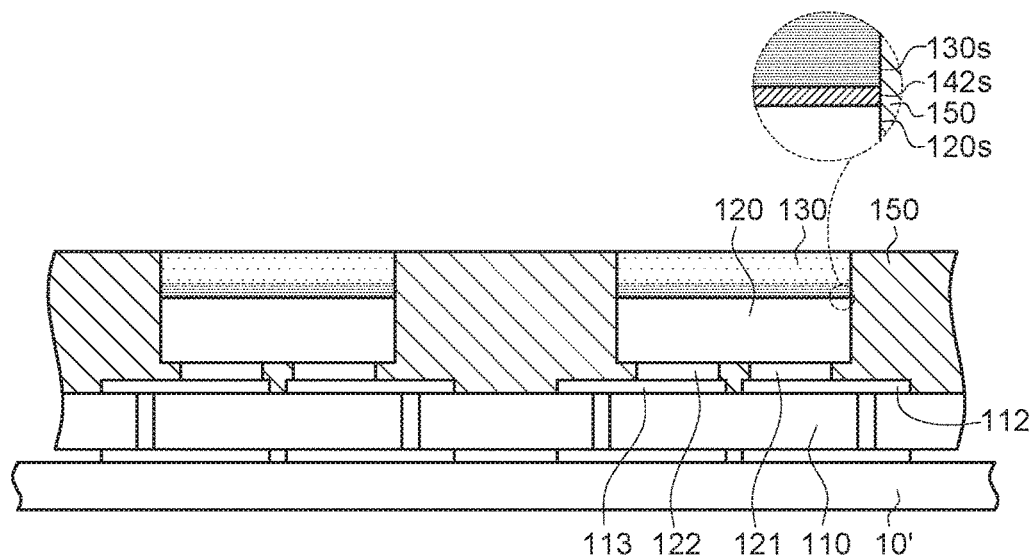
Figure 7C:
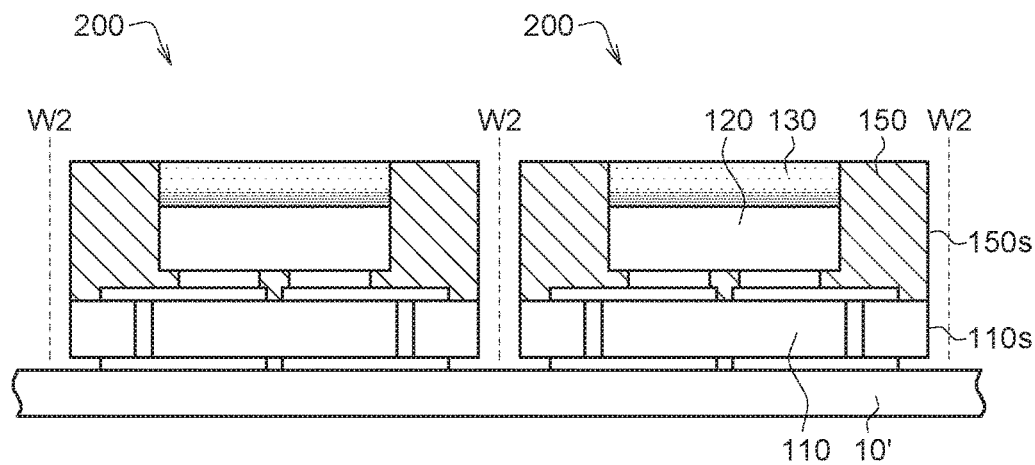

FIGS. 7A to 7C illustrate manufacturing processes of the light-emitting device 200 of FIG. 2.

Figure 6C:
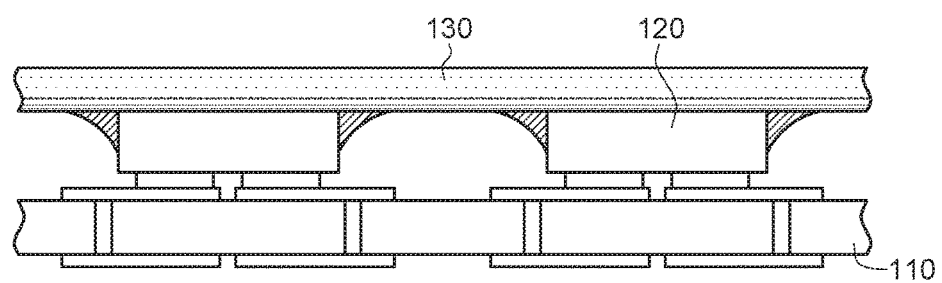

Firstly, the structure of FIG. 5E is formed by using the processes of FIG. 5A to 5E, or the structure of FIG. 6C is formed by using the processes of FIG. 6A to 6C.

Then, as illustrated in FIG. 7A, at least one first singulation path W1 passing through the wavelength conversion layer 130 and the first lateral portion 141 which covers the lateral surface 120s of the light-emitting component 120 is formed, by way of cutting, to cut off the wavelength conversion layer 130 and remove the first lateral portion 141. Since the first singulation path W1 cuts off the first lateral portion 141, such that the entire lateral surface 120s of the light-emitting component 120 and the entire lateral surface 142s of the heat resistance layer 142 are be formed and exposed.

As illustrated in FIG. 7B, the fluid reflective layer 150 is formed above the substrate 110 by way of, for example, compression molding, wherein the reflective layer 150 covers the entire lateral surface 120s of the light-emitting component 120, the entire lateral surface 142s of the heat resistance layer 142, the entire lateral surface 130s of the wavelength conversion layer 130, the lateral surface of the third electrode 112 of the substrate 110, the lateral surface of the fourth electrode 113 of the substrate 110, the lateral surface of the first electrode 121 of the light-emitting component 120 and the lateral surface of the second electrode 122 of the light-emitting component 120.

Then, the reflective layer 150 is cured by way of heating.

As illustrated in FIG. 7C, at least one second singulation path W2 passing through the reflective layer 150 and the substrate 110 is formed, by way of cutting, to form the light-emitting device 200 of FIG. 2. The lateral surface 150s of the reflective layer 150 and the lateral surface 110s of the substrate 110 are formed by the second singulation path W2, wherein the lateral surface 150s and the lateral surface 110s are substantially aligned or flush with each other.

Figure 8A:
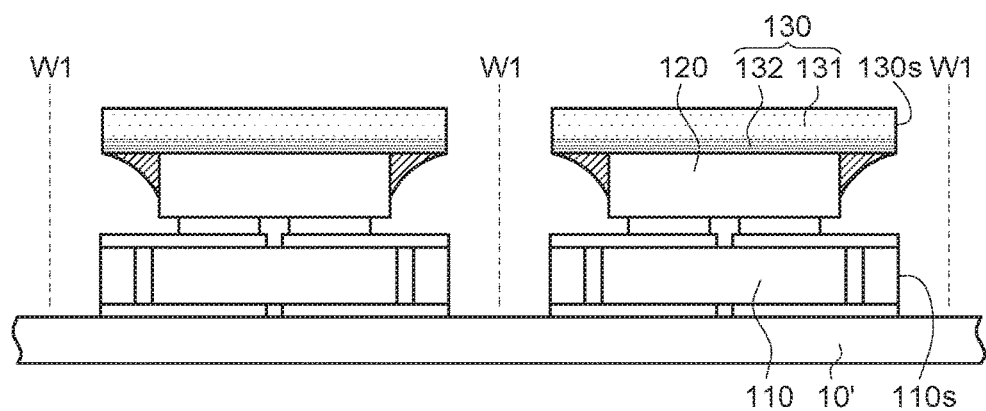
FIGS. 8A to 8C illustrate manufacturing processes of the light-emitting device of FIG. 3.
Figure 8B:
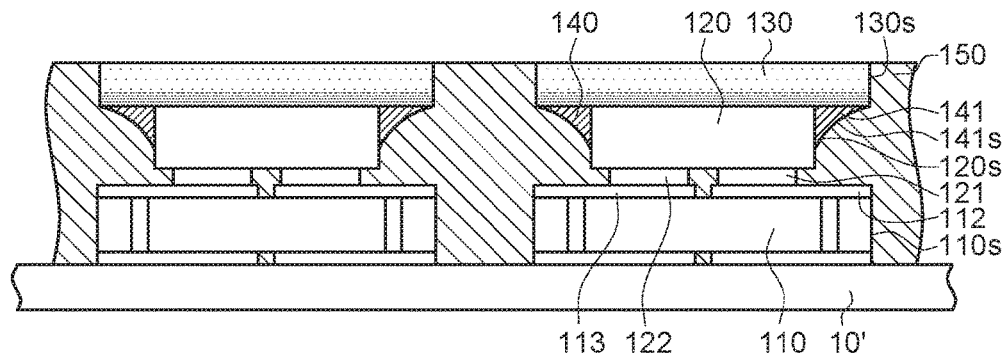
Figure 8C:
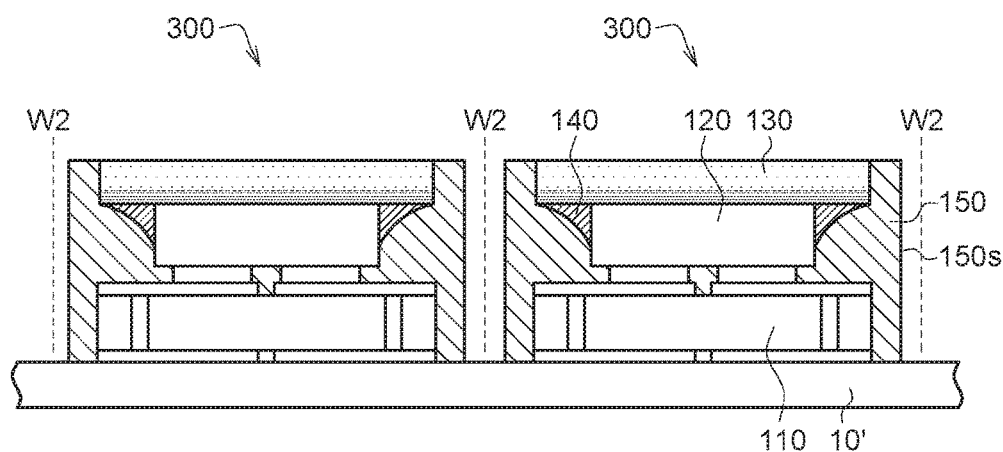

FIGS. 8A to 8C illustrate manufacturing processes of the light-emitting device 300 of FIG. 3.

Firstly, the structure of FIG. 5E is formed by using the processes of FIG. 5A to 5E, or the structure of FIG. 6O is formed by using the processes of FIG. 6A to 6O.

Then, as illustrated in FIG. 8A, at least one first singulation path W1 passing through the wavelength conversion layer 130 and the substrate 110 is formed, by way of cutting, to cut off the wavelength conversion layer 130 and the substrate 110. The lateral surface 130s of the wavelength conversion layer 130 and the lateral surface 110s of the substrate 110 are formed by the first singulation path W1, wherein the lateral surface 130s and the lateral surface 110s are substantially aligned or flush with each other.

As illustrated in FIG. 8B, the fluid reflective layer 150 is formed above the substrate 110 by way of, for example, dispensing, wherein the reflective layer 150 covers a portion of the lateral surface 120s of the light-emitting component 120, the lateral surface 130s of the wavelength conversion layer 130, the lateral surface 141s of the first lateral portion 141 of the adhesive layer 140, the lateral surface 110s of the substrate 110, the lateral surface of the third electrode 112 of the substrate 110, the lateral surface of the fourth electrode 113 of the substrate 110, the lateral surface of the first electrode 121 of the light-emitting component 120 and the lateral surface of the second electrode 122 of the light-emitting component 120.

Then, the reflective layer 150 is cured by way of heating.

As illustrated in FIG. 8C, at least one second singulation path W2 passing through the reflective layer 150 is formed to form the light-emitting device 300 of FIG. 3, wherein the lateral surface 150s and the reflective layer 150 is formed by the second singulation path W2.

In another embodiment, the second singulation path W2 may pass through the wavelength conversion layer 130, the reflective layer 150 and the substrate 110, such that the wavelength conversion layer 130, the reflective layer 150 and the substrate 110 form the lateral surface 130s, the lateral surface 150s and lateral surface 110s respectively, wherein the lateral surface 130s, the lateral surface 150s and lateral surface 110s are substantially aligned or flush with each other.

FIGS. 9A to 9F illustrate manufacturing processes of the light-emitting device 400 of FIG. 4.

As illustrated in FIG. 9A, the substrate 110 and a plurality of the light-emitting components 120 are provided, wherein the light-emitting components 120 are disposed on the substrate 110.

As illustrated in FIG. 9A, the substrate 110 and the light-emitting components 120 are disposed on the carrier 10'.

As illustrated in FIG. 9B, the adhesive layer 140 is formed on the upper surface 120u of the light-emitting component 120 by way of, for example, applying or dispensing.

As illustrated in FIG. 9O, the wavelength conversion layer 130 is disposed on the adhesive layer 140, such that the adhesive layer 140 adheres each light-emitting component 120 to the high-density phosphor layer 131 of the wavelength conversion layer 130. Since the wavelength conversion layer 130 extrudes the adhesive layer 140, the adhesive layer 140 flow toward two sides of the light-emitting component 120 to form the first lateral portion 141. The first lateral portion 141 has the lateral surface 141s. Due to surface tension, the lateral surface 141s is a concave surface. However, depending on the amount of the adhesive layer 140 and/or the property of the adhesive layer 140, the lateral surface 141s may form a convex surface facing substrate 110. In addition, depending on the amount of the adhesive layer 140 and/or the property of the adhesive layer 140, the first lateral portion 141 may cover at least a portion of the lateral surface 120s of the light-emitting component 120.

As illustrated in an enlargement view of FIG. 9O, a portion of the adhesive layer 140 which remains on between the wavelength conversion layer 130 and the light-emitting component 120 forms the heat resistance layer 142. The heat resistance layer 142 can increase the heat resistance between the light-emitting component 120 and the wavelength conversion layer 130, and accordingly it can slow the degrading speed of the wavelength conversion layer 130.

In addition, the adhesive layer 140 further includes the second lateral portion 143 which is formed between adjacent two light-emitting components 120. The second lateral portion 143 has the lower surface 143s. Due to surface tension, the lower surface 143s forms a concave surface facing the substrate 110. However, depending on the amount of the adhesive layer 140 and/or the property of the adhesive layer 140, the lower surface 143s may be a concave surface facing the substrate 110.

As illustrated in FIG. 9D, at least one first singulation path W1 passing through the wavelength conversion layer 130 is formed to cut off the wavelength conversion layer 130. In the present embodiment, the first singulation path W1 does not pass through the first lateral portion 141 of the adhesive layer 140. In another embodiment, the first singulation path W1 may pass through a portion of the first lateral portion 141 or the entire first lateral portion 141.

As illustrated in FIG. 9E, the fluid reflective layer 150 is formed above the substrate 110 by way of, for example, dispensing, wherein the reflective layer 150 covers a portion of the lateral surface 120s of the light-emitting component 120, the lateral surface 130s of the wavelength conversion layer 130, the lateral surface 141s of the first lateral portion 141 of the adhesive layer 140, the lower surface 143s of the second lateral portion 143, the lateral surface of the third electrode 112 of the substrate 110, the lateral surface of the fourth electrode 113 of the substrate 110, the lateral surface of the first electrode 121 of the light-emitting component 120 and the lateral surface of the second electrode 122 of the light-emitting component 120 through the first singulation path W1.

In addition, the reflective layer 150 includes the first reflective portion 151 and the second reflective portion 153, wherein the first reflective portion 151 covers the first lateral portion 141, and the second reflective portion 153 covers the second lateral portion 143. The first reflective portion 151 has the first reflective surface 151s complying with the lateral surface 141s, and the first reflective surface 151s is a convex surface due to the lateral surface 141s being a concave surface. The second reflective portion 153 has the second reflective surface 153s complying with the lower surface 143s, and the second reflective surface 153s is a concave surface due to the lateral surface 141s being a convex surface.

Then, the reflective layer 150 is cured by way of heating.

As illustrated in FIG. 9F, at least one second singulation path W2 passing through the reflective layer 150 and the substrate 110 is formed to form the light-emitting device 400 of FIG. 4. The lateral surface 150s of the reflective layer 150 and the lateral surface 110s of the substrate 110 are formed by the second singulation path W2, wherein the lateral surface 150s and the lateral surface 110s are substantially aligned or flush with each other.

In another embodiment, the second singulation path W2 may pass through the wavelength conversion layer 130, the reflective layer 150 and the substrate 110, such that the wavelength conversion layer 130, the reflective layer 150 and the substrate 110 form the lateral surface 130s, the lateral surface 150s and lateral surface 110s respectively, wherein the lateral surface 130s, the lateral surface 150s and lateral surface 110s are substantially aligned or flush with each other.

In other embodiment, the reflective layer 150 of the light-emitting device 400 may cover the lateral surface 120s of at least one light-emitting component 120, the lateral surface 142s of the heat resistance layer 142 and the lateral surface 130s of the wavelength conversion layer 130 by using processes of FIGS. 7A to 7C.

In other embodiment, the reflective layer 150 of the light-emitting device 400 may cover the lateral surface 110s of the substrate 110 by using processes of FIGS. 8A to 8B.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A light-emitting device, comprises:
a substrate;
a light-emitting component disposed on the substrate and electrically connected thereto;
a wavelength conversion layer, disposed on the light-emitting component and having a high-density phosphor layer and a low-density phosphor layer stacked vertically, wherein the high-density phosphor layer has a substantially uniform thickness;
an adhesive layer disposed between the light-emitting component and the substrate and covering an upper surface and a portion of a lateral surface of the light-emitting component, wherein the high-density phosphor layer is spaced from the upper surface of the light-emitting component by the adhesive layer; and
a reflective layer disposed above the substrate and at least surrounding the light-emitting component and the adhesive layer, wherein the reflective layer has an inclined reflective surface, the inclined reflective surface contacts a portion of the light-emitting component and is gradually away from the light-emitting component along a direction from the substrate toward the wavelength conversion layer.

2. The light-emitting device according to claim 1, wherein the high-density phosphor layer is disposed between the low-density phosphor layer and the light-emitting component.

3. The light-emitting device according to claim 1 wherein the inclined reflective surface is a convex surface facing the wavelength conversion layer, the adhesive layer and the light-emitting component.

4. The light-emitting device according to claim 1, wherein the reflective layer covers at least a portion of a lateral surface of the wavelength conversion layer.

5. The light-emitting device according to claim 1, wherein an area of a bottom surface of the wavelength conversion layer is larger than an area of the upper surface of the light-emitting component.

6. The light-emitting device according to claim 1, wherein the light-emitting device has a flat top surface comprising the reflective layer and the wavelength conversion layer surrounded by the reflective layer.

7. The light-emitting device according to claim 1, wherein the light-emitting device has a flat lateral surface comprising the reflective layer and the substrate.

8. A light-emitting device, comprises:
a substrate;
a light-emitting component disposed on the substrate and electrically connected thereto;
a wavelength conversion layer disposed on the light-emitting component and at least covering an upper surface of the light-emitting component, wherein the wavelength conversion layer has a substantially uniform thickness and is spaced from the upper surface of the light-emitting component by an adhesive layer adhering the wavelength conversion layer to the light-emitting component; and
a reflective layer disposed above the substrate and surrounding the light-emitting component and the wavelength conversion layer, wherein the reflective layer has a reflective surface, the reflective surface contacts at least a portion of the light-emitting component and a portion of the wavelength conversion layer.

9. The light-emitting device according to claim 8, wherein the wavelength conversion layer comprises a high-density phosphor layer and a low-density phosphor layer stacked vertically.

10. The light-emitting device according to claim 9, wherein the high-density phosphor layer is disposed between the low-density phosphor layer and the light-emitting component.

11. The light-emitting device according to claim 8, wherein the reflective layer covers at least a portion of a lateral surface of the wavelength conversion layer.

12. The light-emitting device according to claim 8, wherein an area of a bottom surface of the wavelength conversion layer is equal to an area of the upper surface of the light-emitting component.

13. The light-emitting device according to claim 8, wherein the light-emitting device has a flat lateral surface comprising the reflective layer and the substrate.

14. A light-emitting device, comprises:
a substrate;
a light-emitting component disposed on the substrate and electrically connected thereto;
a wavelength conversion layer disposed on the light-emitting component, wherein the wavelength conversion layer has a substantially uniform thickness;
an adhesive layer disposed between the light-emitting component and the substrate and covering an upper surface and at least a portion of the lateral surface of the light-emitting component, wherein the wavelength conversion layer is spaced from the upper surface of the light-emitting component by the adhesive layer; and
a reflective layer disposed above the substrate and surrounding the light-emitting component, the adhesive layer and the wavelength conversion layer, wherein the reflective layer has an inclined reflective surface, the inclined reflective surface contacts a portion of the light-emitting component and a portion of the wavelength conversion layer, and the inclined reflective surface is gradually away from the light-emitting component along a direction from the substrate toward the wavelength conversion layer;
wherein the light-emitting device has a flat lateral surface comprising the reflective layer and the substrate.

15. The light-emitting device according to claim 14, wherein the wavelength conversion layer comprises a high-density phosphor layer and a low-density phosphor layer stacked vertically.

16. The light-emitting device according to claim 15, wherein the high-density phosphor layer is disposed between the low-density phosphor layer and the light-emitting component.

17. The light-emitting device according to claim 14 wherein the inclined reflective surface is a convex surface facing the wavelength conversion layer, the adhesive layer and the light-emitting component.

18. The light-emitting device according to claim 14, wherein the reflective layer covers at least a portion of a lateral surface of the wavelength conversion layer.

* * * * *